United States Patent [19]

Kohno et al.

[11] Patent Number: 5,159,434
[45] Date of Patent: Oct. 27, 1992

[54] SEMICONDUCTOR DEVICE HAVING A PARTICULAR CHIP PAD STRUCTURE

[75] Inventors: Ryuji Kohno, Ibaraki; Makoto Kitano, Tsuchiura; Asao Nishimura, Ushiku; Akihiro Yaguchi; Sueo Kawai, both of Ibaraki, all of Japan

[73] Assignee: Hitachi, Ltd., Tokyo, Japan

[21] Appl. No.: 649,712

[22] Filed: Feb. 1, 1991

[30] Foreign Application Priority Data

Feb. 1, 1990 [JP] Japan ................... 2-23457

[51] Int. Cl.[5] .................. H01L 23/12; H01L 23/14
[52] U.S. Cl. ................................. 357/80; 357/68
[58] Field of Search ............... 357/80, 74, 72, 70, 357/68; 174/52.4

[56] References Cited

U.S. PATENT DOCUMENTS

| | | | |
|---|---|---|---|
| 4,827,328 | 5/1989 | Ozawa et al. | 357/80 |
| 4,893,172 | 1/1990 | Matsumoto et al. | 357/80 |
| 4,901,136 | 2/1990 | Neugebauer et al. | 357/74 |
| 4,910,584 | 3/1990 | Mizuo | 357/74 |
| 4,922,324 | 5/1990 | Sudo | 357/80 |
| 4,941,033 | 7/1990 | Kishida | 357/80 |

FOREIGN PATENT DOCUMENTS 57-141933 9/1982 Japan .

OTHER PUBLICATIONS

Nikkei Electronics, Mar. 1, 1982, pp. 120-124.

*Primary Examiner*—Rolf Hille
*Assistant Examiner*—S. V. Clark
*Attorney, Agent, or Firm*—Antonelli, Terry, Stout & Kraus

[57] ABSTRACT

An encapsulated semiconductor device has a chip, a chip pad having through holes and also conducting patterns corresponding to an electrode pad of the chip, and leads. An arbitrary external terminal arrangement is obtained by combining a wire bonding operation between the conduting pattern and lead. Wire bonding is advantageously performed between the leads and electrode pads of the semiconductor chip arranged at arbitrary positions. The degree of freedom in designing areas of the chips and also a printed circuit board is improved so that a high packaging density is achieved and furthermore the printed circuit board is made compact.

27 Claims, 7 Drawing Sheets

SEMICONDUCTOR DEVICE HAVING A PARTICULAR CHIP PAD STRUCTURE

BACKGROUND OF THE INVENTION

The present invention generally relates to a packaged semiconductor device, and more specifically to a packaged semiconductor device in which a terminal arrangement of external leads can be freely changed and in which electrode pads of a chip are and readily electrically connected to the external leads.

In a conventional packaged semiconductor device (referred to as a "device" hereinafter), generally only one terminal arrangement has been determined at a designing process and, an electrode pad of a chip is directly and electrically connected to a preselected lead by employing a conducting or conductive wire in accordance with this terminal arrangement. These components are then encapsulated by, for example, a resin, ceramics or a can. To modify the terminal arrangement, there is no means other than changing the design of the electrode pad arrangement of the chip. Thus, in principle, such a terminal arrangement modification is not a practical solution. Furthermore, in general, the electrode pads employed in the chip are regularly arranged at the outer peripheral portion of the chip, taking account of the terminal arrangement and position for the leads.

In the publication of JP-A-57-141933 (laid-open on Sept. 2, 1982), there is disclosed that both the electrode pads and external leads which have been regularly arranged at the outer peripheral portion of the chip are connected to the external leads by way of a conductive layer having a predetermined shape and formed on the insulating film.

According to the conventional prior art, there is little degree of freedom in arranging terminals of devices to users. Thus, in manufacturing printed boards after selections have been made of devices and other circuit parts employed in respective portions of a package, circuit patterns will have to be designed in accordance with the terminal arrangements of them.

However, there are some cases that the circuit patterns must be formed along ineffective paths. As a result, the resultant circuit patterns become complex and, at the same time, the dimension of the circuit board becomes bulky, which may impede optimum designing of circuit boards.

Also, in accordance with the conventional techniques, there is no way other than a design modification of a chip per se so as to modify a terminal arrangement of a device. If this principle designing policy is neglected, and if attempts are made to modify connection combinations between the electrode pads of the device and the leads thereof, there are some risks that connecting wires may cross with each other or become very long, thereby causing short circuits, or other problems Furthermore, in accordance with the conventional prior art, the electrode pads employed in the chip must be arranged in a regular form, taking account of the terminal arrangement and positions of the leads at the peripheral portions of the chip. As a consequence, wiring pattern is necessarily provided within the circuit of the chip.

Meanwhile, packages are described in NIKKEI ELECTRONICS, Mar. 1, 1982, pp. 120–124, the packages having a structure in which TAB and flip chip technologies are utilized in combination.

SUMMARY OF THE INVENTION

An object of the present invention is to provide such a semiconductor device that a terminal arrangement of external leads is freely changeable at a manufacturing stage of the device, especially at a wire bonding stage, without modifying a chip, an outer appearance of the device, otherwise electrode pads need not be arranged in a regular form with the chip, namely the electrode pads arbitrarily formed on a surface of the chip are electrically connectable with the leads.

In accordance with one feature of the present invention, in a semiconductor device comprising a chip pad having a conducting pattern; a semiconductor-chip equipped with an electrode pad to be mounted on a chip pad; and a lead connected via the conducting pattern to the electrode pad, these members are encapsulated, and it is achieved that a through hole is formed on the chip pad at a position corresponding to the electrode pad of the semiconductor-chip; the conducting pattern is formed on an insulating material formed on the chip pad; the semiconductor-chip is mounted on a plane of the chip pad positioned opposite to another plane thereof on which the conducting pattern has been formed in such a manner that the electrode pad thereof is positioned opposite to the through hole; the electrode pad of the semiconductor-chip is electrically connected to the conducting pattern by a first conducting member provided within the through hole; and also the conducting pattern is electrically connected to the lead by a second conducting member.

Furthermore, according to another feature of the present invention, in a semiconductor device comprising a chip pad having a conducting pattern; a semiconductor-chip equipped with an electrode pad to be mounted on the chip pad; and a lead connected via the conducting pattern to the electrode pad, these members are encapsulated, and it is achieved that the chip pad is an insulating member in which a through hole has been formed at a position corresponding to the electrode pad of the semiconductor-chip; the semiconductor-chip is mounted on a plane of the chip pad positioned opposite to another plane thereof on which the conducting pattern has been formed in such a manner that the electrode pad thereof is positioned opposite to the through hole; the electrode pad of the semiconductor-chip is electrically connected to the conducting pattern by a first conducting member provided within the through hole; and also the conducting pattern is electrically connected to the lead by a second conducting member.

The above-described object of the present invention may be achieved in a semiconductor device comprising a semiconductor-chip equipped with an electrode pad; and a lead connected to the electrode pad, these members being encapsulated, in which a plane of the semiconductor-chip on which the electrode pad has been formed is covered with an insulating material; a through hole is formed on the insulating material at a position opposite to the electrode pad; a conducting pattern is provided on a surface of the insulating material; the electrode pad of the semiconductor-chip is electrically connected to the conducting pattern by a first conducting member provided within the through hole; and also the conducting pattern is electrically connected to the lead by a second conducting member.

It is preferable that the first conducting member is a conducting wire for connecting at least one set of the electrode pad and conducting pattern.

It is also preferable that at least one of the first and second conducting members is a conducting wire covered with an insulating material.

Also, it is preferable that at least one of the first and second conducting members is solder.

Further, it is preferable that the conducting pattern is constructed of a plurality of lines which are arranged parallel to each other along a longitudinal direction of the semiconductor-chip.

Then, it is preferable that there is formed at least one portion of a line for forming the conducting pattern, a width of which is made larger than that of other line portions, and one end of the second conducting member is connected to the line portion having the larger width.

Moreover, it is preferable that an interval between one lead and another lead positioned across a chip pad from the first-mentioned lead is smaller than a width of the semiconductor-chip at this portion.

In addition, it is preferable that a portion of the lead connected to the second conducting member is arranged at an outer peripheral portion at a side of long edges of the chip pad.

In accordance with an embodiment of the semiconductor device of the present invention, the respective electrode pads of the chip are connected to a chip pad or to conductive or conducting patterns which have been formed on an insulating member or insulating material by the first conducting member, whereas the leads of the device are electrically connected to the arbitrary positions of the conductive patterns by way of the second conducting member.

The respective conductive patterns are so arranged that they form a line shape along the arranging direction of the leads, for instance, along the longitudinal direction of the device. The respective leads are connected to the conductive patterns which have been connected to the electrode patterns to be connected therewith, without crossing with other second conducting members connected to other leads.

The connection between the conductive pattern and the leads can be performed in such a manner that each lead is connected to a portion of the conductive pattern which is the nearest thereto or connected to a most preferred portion of the conductive pattern.

Also, in accordance with another embodiment of the present invention, since the electrode pads of the chip are connected to the leads via the conductive patterns capable of having desirable shapes, even if the positions of these electrode pads are present on the chip, there is no problem in the lead connection. Conversely, even when there are any types of lead arrangement, the connection between one conductive pattern and a certain lead ma be established with the optimum position without causing any interference in the connections among the conductive patterns and other leads.

In accordance with a preferred embodiment of the present invention, since the electrode pads of the chip are connected by the conductive patterns capable of having arbitrary shapes, and also the leads are connected to these conductive patterns at the shortest positions with respect to these leads, or at the optimum positions, it may be prevented that the wire paths for connecting the leads with the conductive patterns become complex or lengthy. Thus, the terminal arrangement of the leads may be set irrelevant to the electrode pad arrangements for the chip, and furthermore both the circuitry of the printed circuit board and the component arrangements may be readily optimized. Also, there is another particular advantage that the dimension of the printed circuit board may be made compact.

DESCRIPTION OF THE PREFERRED EMBODIMENTS

Figure 1:
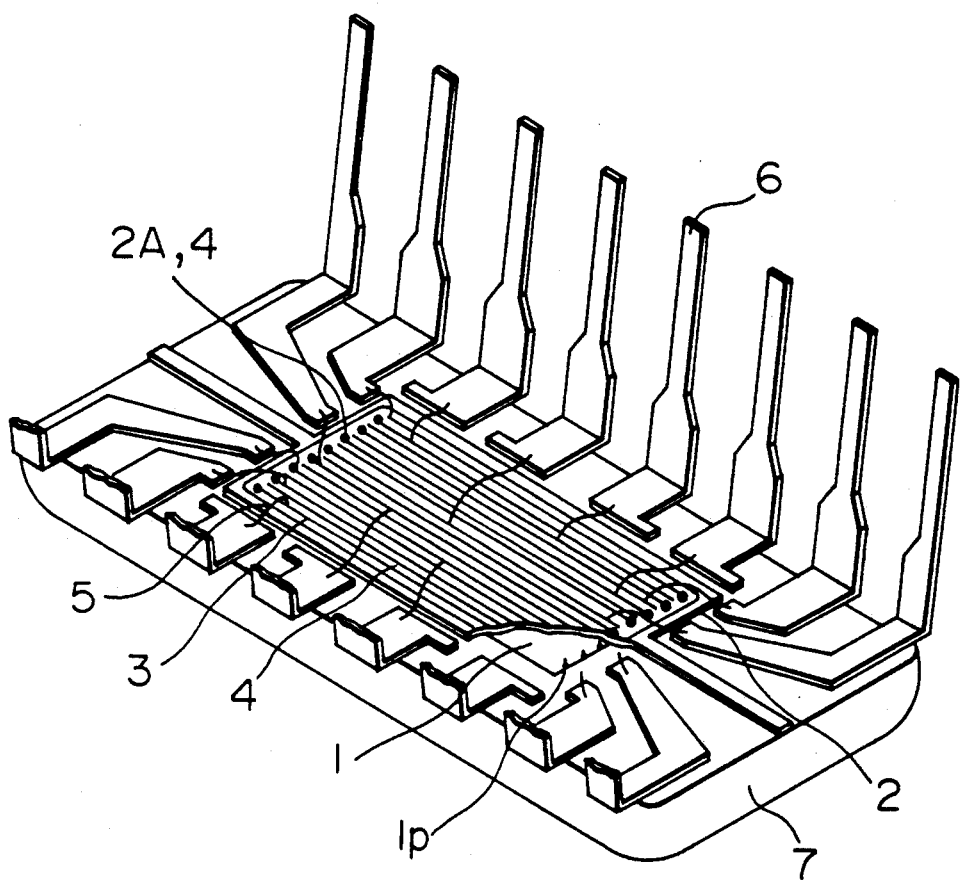
FIGS. 1, 3 and 5 are perspective views partially cut away according to first to third embodiments of the present invention.
Figure 2:
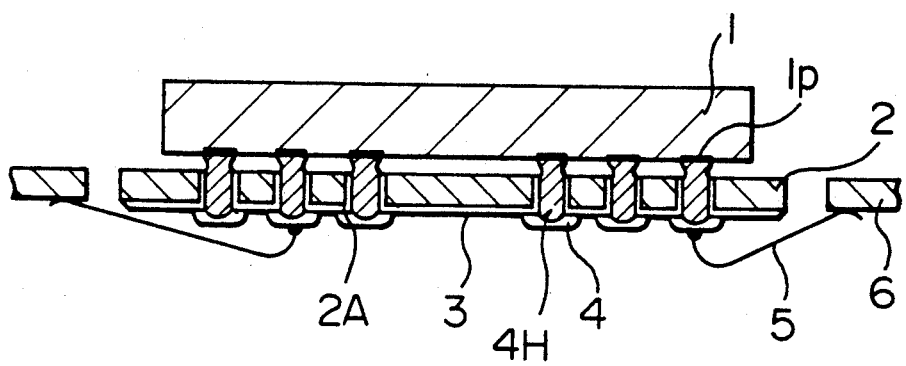
FIGS. 2, 4 and 6 are cross-sectional views of the embodiments shown in FIGS. 1, 3 and 5 from which resins have been removed.

Referring now to FIGS. 1 and 2, a first embodiment of the present invention will be described. In the first embodiment, the present invention has been applied to an encapsulated semiconductor device. FIG. 1 represents such a condition that a portion of resin has been removed and a surface a semiconductor-chip opposite to a printed circuit board is positioned upwardly on the drawing. FIG. 2 represents a cross section of an electrode pad position of a chip under condition that the resin of the semiconductor device shown in FIG. 1 has been removed. FIG. 2 is a simplified diagram in which the number of electrode pads is reduced for the sake of easy understanding.

A chip 1 is mounted on a chip pad 2 in such a manner that an electrode pad 1P thereof is positioned opposite to the chip pad 2. Through holes 2A are formed in the chip pad 2 at all positions thereof opposite to the electrode pad 1P of the chip when the chip is mounted. Since the same conducting material as that of leads has been employed to manufacture the chip pad 2, an insulating coat or material 3 is mounted on both a surface of this chip pad 2 positioned opposite to another surface thereof for mounting the chip 1 thereon, and also an inner peripheral surface of the above-described through hole 2A, and a conducting pattern 4 is formed on the insulating coat 3 which is made of a set of parallel lines arranged along a long edge of the chip pad 2. One end of the respective parallel lines becomes the through hole 2A. The electrode pads 1P are electrically connected to the conducting patterns 4 formed on the chip pad 2 by using solder made of a first conducting material 4H and formed within the through hole 2A.

It should be noted that when a large chip is employed with respect to the dimension of the device, internal stress caused by variations in the use temperatures and the like may be effectively reduced by employing such a material having a linear expansion coefficient similar to that of the chip as the material of the chip pad 2, e.g., alloy 42 which is an alloy made of 42% Ni and 58% Fe.

As previously explained, the conducting patterns 4 are constructed of a plurality of parallel lines. The respective parallel lines are electrically connected to the electrode pad 1P by way of the solder formed within at least one through hole 2A, and also are independently provided with each other in view of electrical connections. In this preferred embodiment, the parallel lines have been employed the total number of which is equal to that of the electrode pads 1P. A plurality of leads 6 are arranged along an outer edge of the chip pad 2. These leads 6 are electrically connected to the conducting patterns 4 by conducting wires 5 (referred to as a "wire" hereinafter) made of a second conducting material.

The connection by the second conducting members between the leads 6, which are to be connected after a desirable terminal arrangement of the device has been determined, and the conducting pattern 4 is performed such that each lead is connected with an arbitrary one point on the nearest or optimum one of the conducting pattern lines. In principle, if a length of the wire, namely a distance from the lead 6 to a line is changed, the connection by the second conducting member may be possible without bending the wire or crossing the wires with each other on an arbitrary conducting pattern 4. In other words, any of these leads 6 may be connected to an arbitrary electrode pads 1P without crossing the wires with each other, or without extending the wires. Furthermore, if the wire 5 is coated with an insulating material, a shortcircuit caused by a sagging of the wire 5 per se can be prevented.

After the device has been fabricated as described above, the entire device is encapsulated by a resin 7. It should be noted that even if the encapsulation is carried out by employing not only a resin, but also ceramics or a can, the present invention may be similarly applied.

Figure 3:
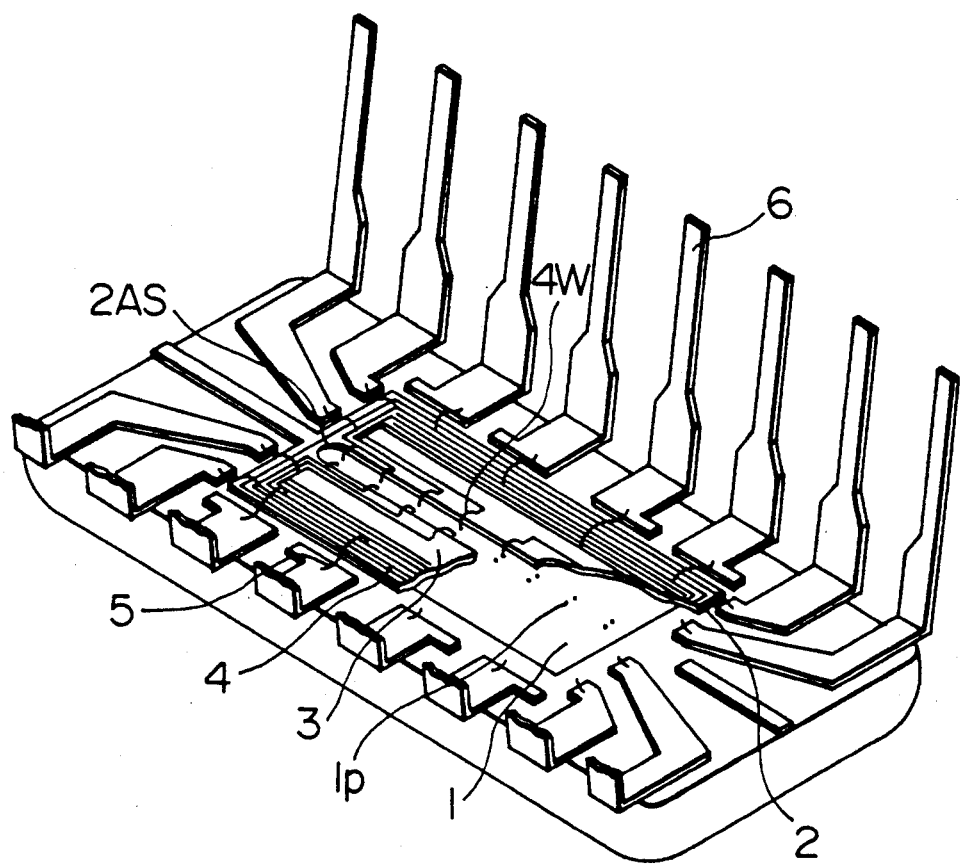
Figure 4:
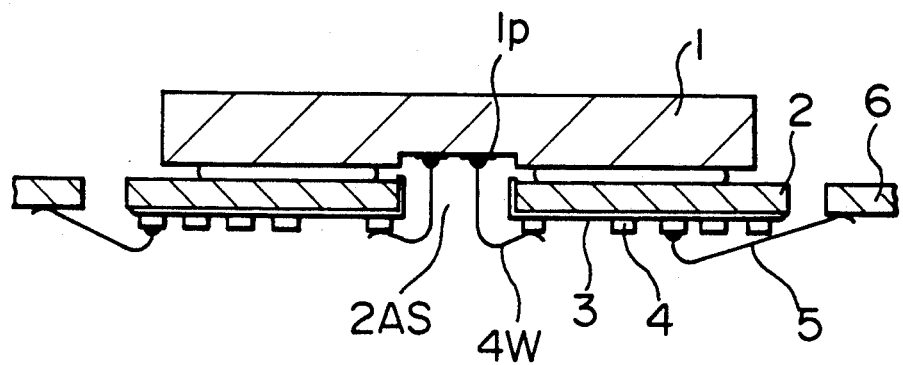

FIG. 3 represents a condition that a portion of a resin employed in a semiconductor device according to a second embodiment of the present invention has been removed, and a plane of this device positioned opposite to a printed circuit board is arranged upwardly. FIG. 4 is a sectional view showing such a condition that the resin of the device shown in FIG. 3 has been removed, along a direction of a width thereof. The structure of FIG. 4 has been simplified, which is similar to FIG. 2.

Two rows of the electrode pad 1P of the chip 1 are arranged along a center line of this element in a longitudinal direction, whereas a through hole 2AS formed in the chip pad 2 has a single slit shape for entirely covering the above-described electrode pad 1P in this embodiment. A first conducting member 4W connects the electrode pad 1P and the conducting pattern 4 through the slit. The conducting pattern 4 is divided into a half by the above-explained slit extending along the longitudinal direction of the device. One end of each divided conducting pattern is generally U-shaped and is connected to the electrode pad 1P by the wire made of the first conducting member. In accordance with this preferred embodiment, it is so constructed that the lead 6 arranged at a longer edge side of the device is connected to the conducting pattern extending on the lead side of the above-described slit.

To avoid undue extension of the wire 5 in a device having a number of leads greater than a predetermined number, or having a chip pad area larger than a predetermined value, electrode pads to be connected to respective leads may be limited to one of the divided halves of the conductive pattern which is nearer to the electrode pads than the other half.

Figure 5:
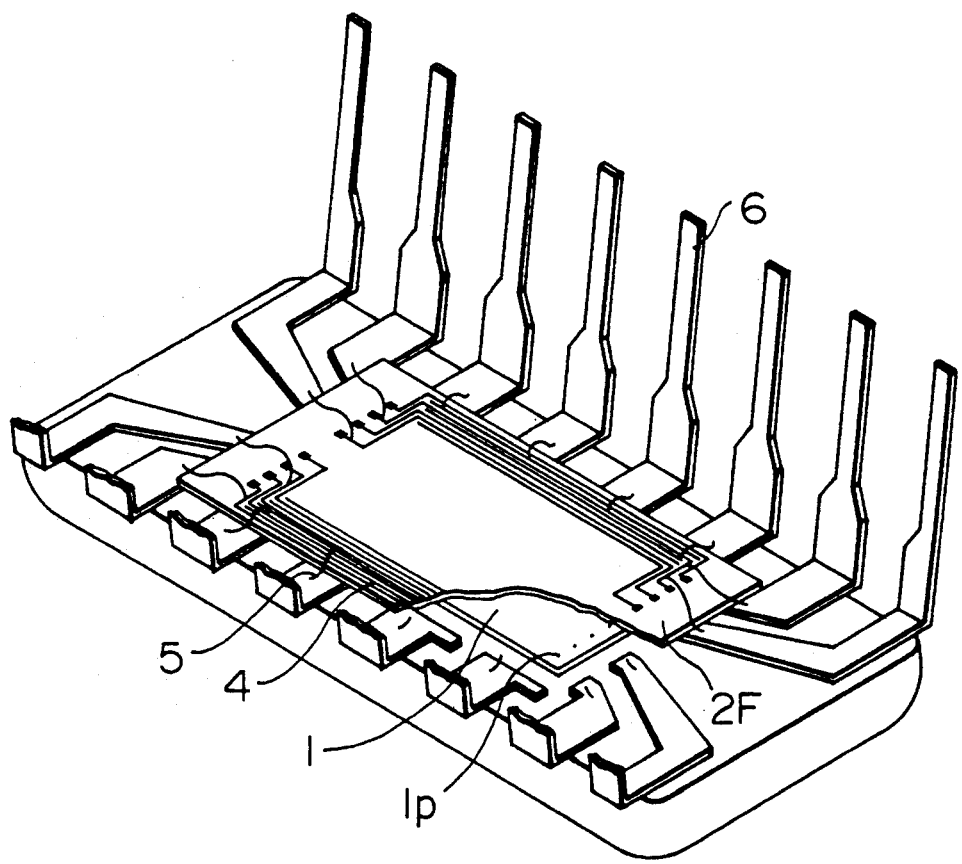
Figure 6:
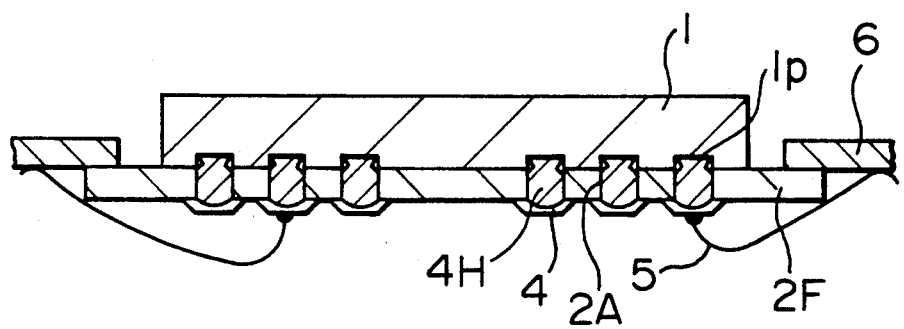

FIG. 5 represents such a condition that a part of a resin of a semiconductor device according to a third embodiment of the present invention has been removed, and a plane of the device positioned opposite to a printed circuit board is arranged upwardly. Also, FIG. 6 represents a section of an electrode pad part of a chip along a direction of a width thereof under such a state that the resin of the device shown in FIG. 5 has been removed, and the structure of FIG. 6 has been simplified, which is similar to FIG. 2.

In this preferred embodiment, the chip 1 is mounted on an insulating film 2F made of an insulating member. An adhesive agent is coated on a surface of this insulating film 2F positioned opposite to the chip 1, the chip 1 is jointed to the lead 6, and also a conducting pattern 4 is formed on a surface of this insulating film 2F positioned opposite to the other surface thereof. The electrode pad 1P of the chip 1 is electrically connected to the conducting pattern 4 by way of solder made of the first conducting member and arranged within the through hole 2A of the insulating film 2F.

According to this embodiment, for instance, polymide is used as the insulating film so that no insulating coat is required on the plane on which the conducting patterns ar formed and also in the through hole 2A. It should be noted that the insulating film may be made of a rubber material such as an Si rubber in order to buffer a difference of expansion between the chip and the resin. Various sorts of plastic thin plates and the like may be used as the insulating member, other than the above-described insulating film 2F.

Figure 7A:
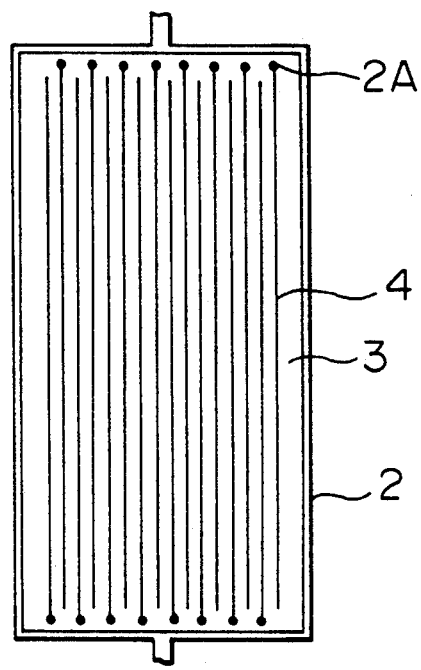
FIGS. 7A, 7B, 8 and 9 are plan views of examples of conducting patterns.

FIG. 7A illustrates an example of a conducting pattern. The conducting pattern 4 shown in this figure is arranged by a set of straight lines which extends from the through holes 2A as a starting point arranged on the short edge of the chip pad in a longitudinal direction of the chip pad parallel thereto. This pattern is effective when a total number of leads is relatively small or a width of the chip pad is relatively small. It should be noted that the through holes 2A arranged along both the short edges of the chip pad 2 may be combined with each other at each short edge to form a single slit shape, respectively. In such a case, a connection similar to that of the second embodiment may be realized.

Figure 7B:
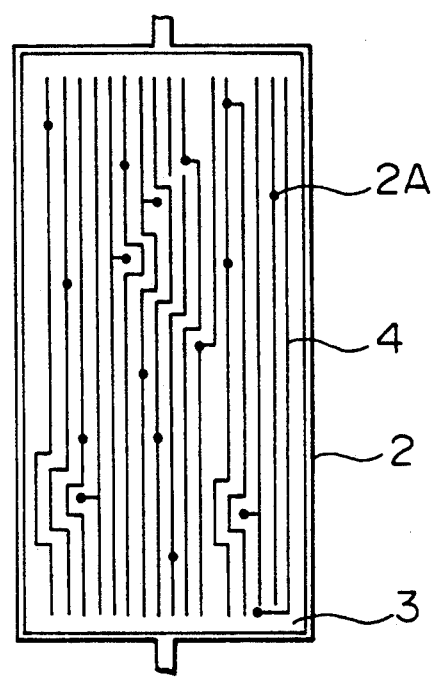

A conducting pattern shown in FIG. 7B is so constructed that through holes 2A are formed at positions coincident with those of electrode pads in order to be fitted to such a chip where the electrode pads are formed at arbitrary positions, and the conducting patterns extend from the respective through holes along long edges of chip pads, which is similar to that shown in FIG. 7A. As a consequence, the positions of these electrode pads may be set preferentially to arrangements in the chip, without taking account of connections with the leads at a stage of designing this chip, thereby simplifying the wiring patterns in the chip. Since there is no need to intentionally arrange the electrode pads of the chip 1 along the peripheral portion of this chip, a large degree of freedom in designing the chip may be expected.

Figure 8:
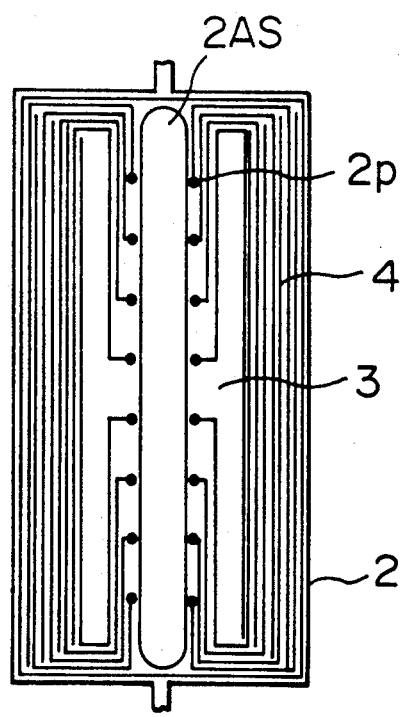

FIG. 8 represents a conducting pattern which is substantially similar to that of the above-described second embodiment. In this embodiment, a slit 2AS is formed along a center line in a longitudinal direction of a chip pad 2, and the conducting pattern 4 is connected to electrode pads of a chip 1 by a first conducting member passing through this slit 2A. Instead of this slit 2A, the through holes 2A may be formed at positions corresponding to the electrode pads of the chip pad 2.

Figure 9:
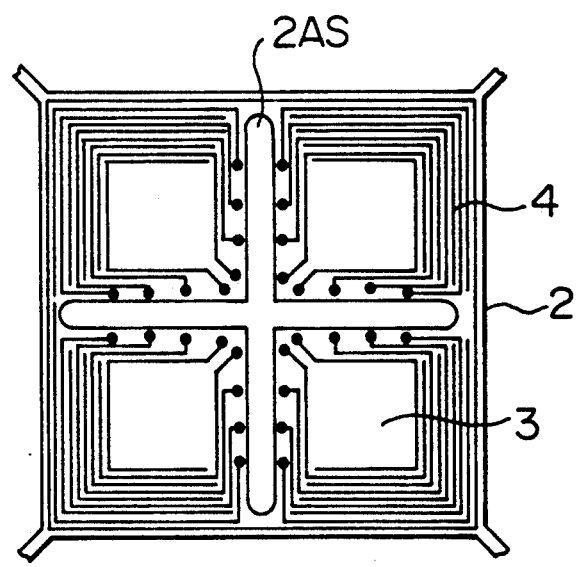

FIG. 9 shows a modification related to the above-described embodiment shown in FIG. 8, and an example which has been applied to a chip pad of a device having a 4-directional lead. In general, when a pitch between the leads is narrow and a total number of leads is large, as compared with those of a device having a 2-directional lead, combinations between the electrode pads of the chip and the leads thereof are restricted and the conducting patterns may be quartered. It should be noted that even when such a 4-directional lead is employed, if a total number of leads is not so large, no limitation is required in the above-described combination. Similarly, instead of the slits, through holes corresponding to the respective electrode pads may be formed, which has been described with reference to FIG. 8.

Figure 10:
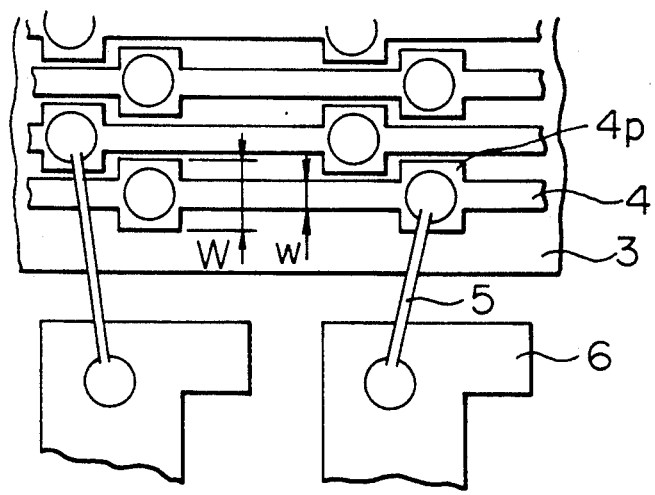
FIG. 10 is a partially enlarged plan view for representing both conducting patterns and leads according to a fourth embodiment.

FIG. 10 is a partially enlarged diagram according to a fourth embodiment of the present invention, which represents such a condition that a conducting pattern 4 formed on a chip pad 2 is connected to a lead by a wire made of a second conducting member.

In this figure, a width "W" of the conducting pattern 4 is made larger than a width "w" of other parts at a position where a length of this conducting pattern 4 is minimum with respect to its associated lead 6, whereby a pad 4P is formed, and also these conducting patterns are arranged in a zigzag form so as to reduce a useless area of the pattern pitch.

As previously described, when the normal pattern width "W" is formed by a fine treatment to be smaller than approximately 80 μm, making the width "W" of this pad portion 4P larger than 80 μm may induce a particular advantage that reliabilities of wire bonding by the second conducting member are improved.

It should be understood that the pads 4P need not be arranged in such a zigzag form when the useless area in the pattern pitch caused by making the width "W" of the pad portion 4P is not so large.

Figure 11:
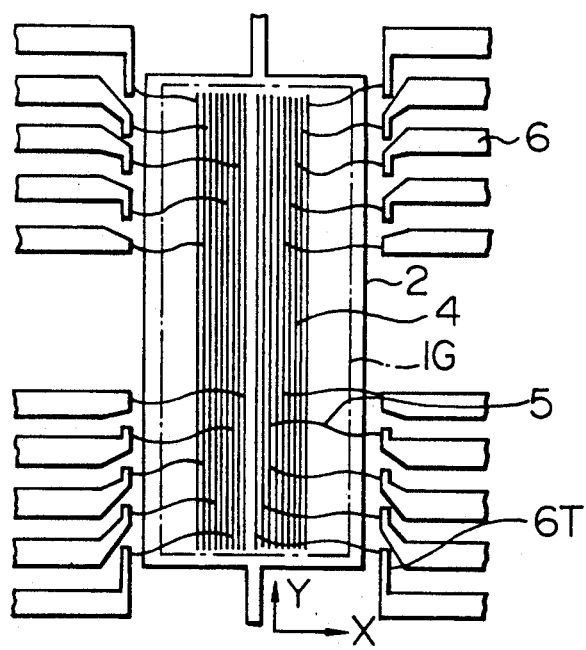
FIG. 11 is a plan view showing a bottom plane of a lead frame according to a fifth embodiment of the present invention.

FIG. 11 is a lower view of a device according to a fifth embodiment of the present invention, in which a connection by a second conducting member has been completed, and a chip has been mounted at a position indicated by an outer dimension 1G from a rear plane.

In the figure, all of wire bonding parts 6T of the respective leads 6 are positioned at an outer peripheral portion on both longer sides of a chip pad, and therefore all of these wires 5 are necessarily bonded parallel to each other. As a consequence, conducting patterns 4 are no longer formed in a direction parallel to a direction of short edges of the chip pad, so that the chip pad may be made compact and, at the same time, the bonding positions may be connected to any of arbitrary conducting patterns 4 by only changing the lengths in an X-direction. Since no adjustment is required in the lengths of the wire along a Y-direction, satisfactory bonding of the leads positioned at the edge portions is facilitated and also a modification of a program employed in a bonding machine may be simplified.

Figure 12:
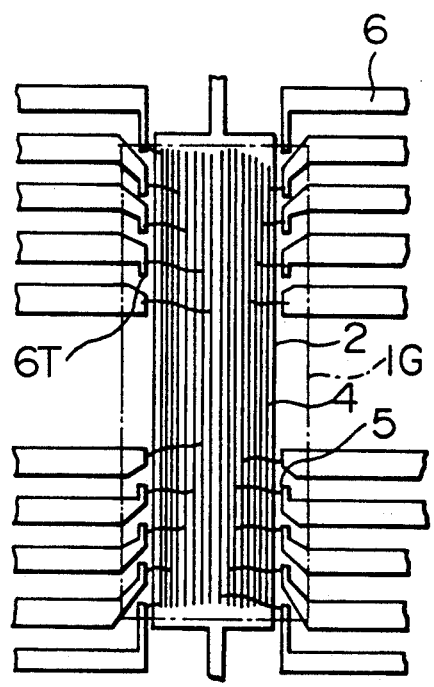
FIG. 12 is a plan view representing a bottom plane of a lead frame according to a sixth embodiment of the present invention.

FIG. 12 represents an example of an application made from the fifth embodiment, according to a sixth embodiment of the present invention. The portion, as viewed in FIG. 11, on which the conducting patterns 4 in the chip pad are not formed, has been removed and in connection therewith, an interval between the leads positioned on both sides of the chip is also reduced. As a specific example of 20-pin SOJ (Small Out line J-bended package), if a pattern pitch is selected to be 100 μm, both sides of a chip pad may be reduced by approximately 2 mm, respectively. As a consequence, a length of a wire 5 may be shortened and furthermore an easy connection between one lead 6 and a conducting pattern 4 positioned far from this lead 6 may be achieved.

In accordance with this preferred embodiment, since the interval of the wire bonding part 6T of both the leads positioned opposite to each other becomes smaller than a dimension of the chip at this wire bonding part 6T along a width direction thereof, tip portions of the leads overlap with the chip, as shown in FIG. 12. As a result, an insulating measure with employment of an adhesive agent or the like must be taken between the chip and the tip portions of the leads.

Figure 13:
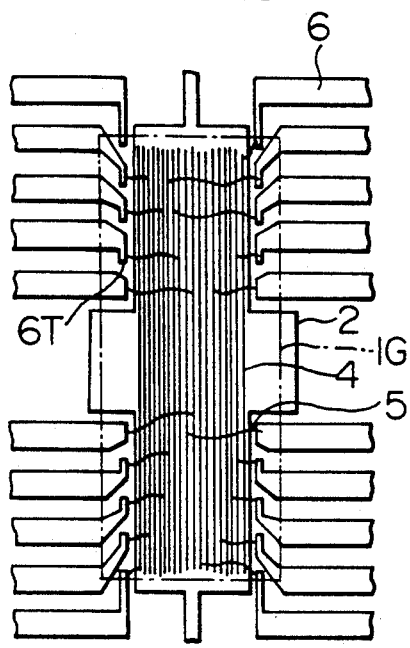
FIG. 13 is a plan view showing a modification of the bottom plane of a lead frame according to the third embodiment.

FIG. 13 shows a structure in which the chip pad has an expanded portion at its central portion viewed in its longitudinal direction where no lead 6 is provided. The expanded portion of the chip pad has a width as large as that of the conventional one. By making the width of the chip pad partially larger than the width of the chip 1, the chip may be stably mounted on the chip pad since a widthwise displacement of the chip and/or jutting of adhesive are suppressed.

Figure 14:
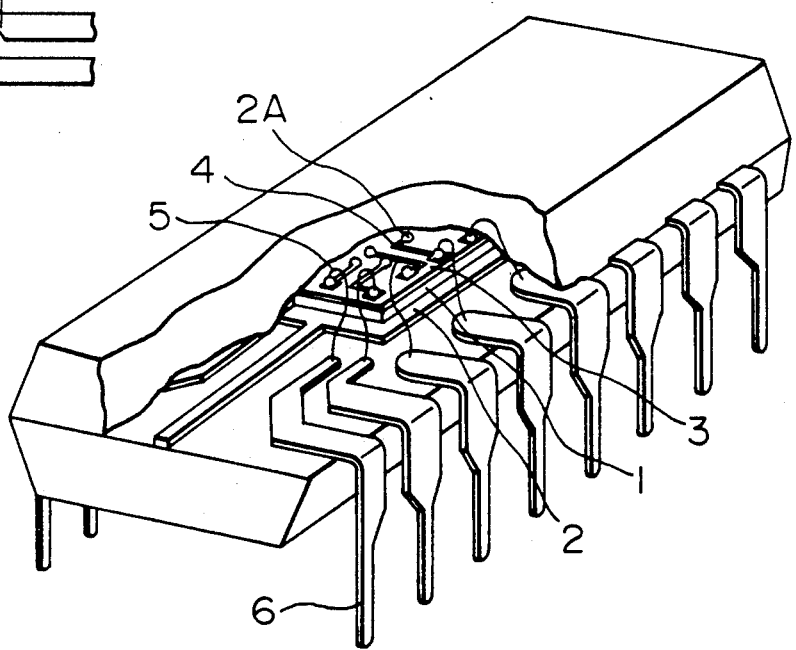
FIG. 14 is a perspective view partially cut away of a seventh embodiment of the present invention.
Figure 15:
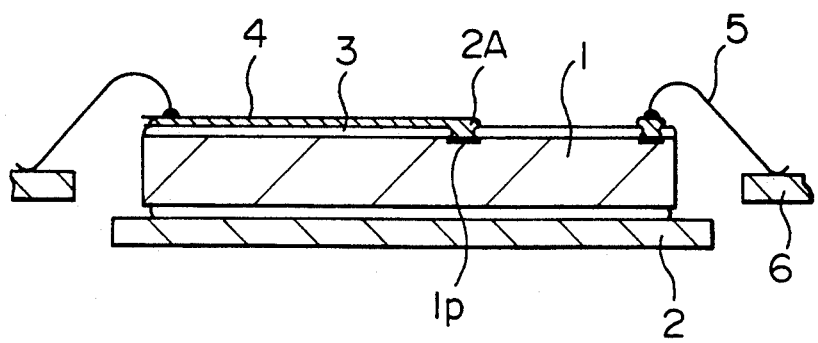
FIG. 15 is a cross-sectional view of the seventh embodiment from which resins have been removed.

FIG. 14 is a perspective view partially cut away of a device according to a seventh embodiment of the present invention, and FIG. 15 is a sectional view of this device under such a condition that a resin thereof has been partially cut away along a direction of a width thereof. Electrode pads 1P are irregularly provided at optimum positions on the surface of the chip 1 which has been determined during the design process without considering the subsequent processing steps, and also an insulating coat 3 formed with a through hole 2A has been coated on positions opposite to these electrode pads 1P. A conducting pattern 4 extends over this insulating coat 3 up to a position where this pattern 4 should be wire-bonded with the leads 6.

Different from each of the above-described preferred embodiments, the present embodiment aims at increasing the degree of freedom of layout designing for the chip, but may be applied as a means for employing the leads as arbitrary terminals, which is similar to the respective embodiments.

Figure 16:
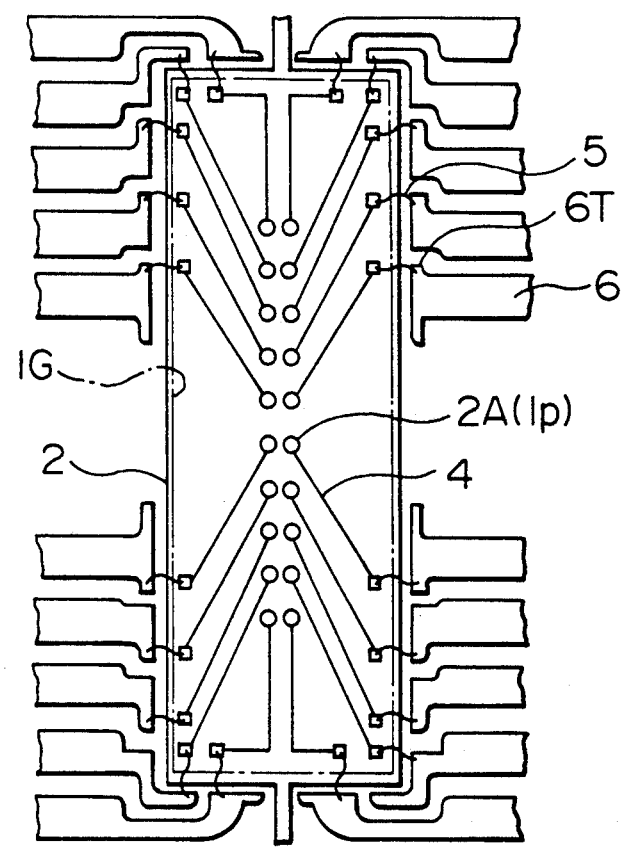
FIG. 16 is a plan view showing an application example of the seventh preferred embodiment.

FIG. 16 illustrates an application example of the seventh embodiment, in which a chip having such a shape that electrode pads employed in a device of an LOC (Lead On Chip) structure are gathered at a center, is mounted on a normal lead frame (i.e., frame formed by a chip pad and leads).

In accordance with this embodiment, wire bonding operation may be carried out irrelevant to the positions of the electrode pads of the chip.

Figure 17:
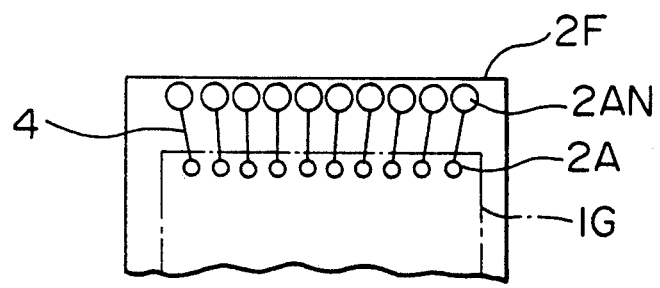
FIG. 17 is a partial plan view of an eighth embodiment according to the present invention.
Figure 18:
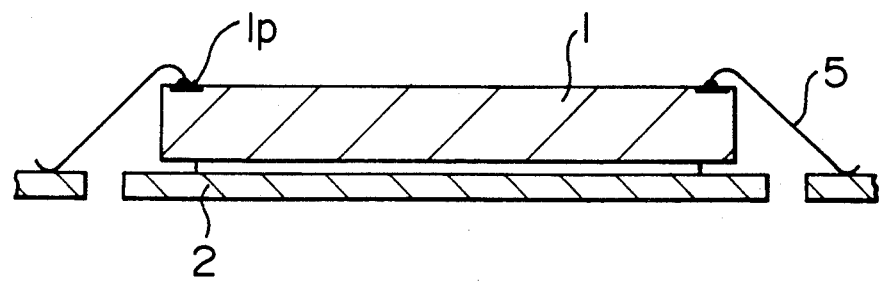
FIG. 18 is a cross-sectional view of prior art.

FIG. 17 illustrates a device according to an eighth embodiment of the present invention, which aims at enlarging an area of electrode pads by employing an insulating film 2F instead of the chip pad. In accordance with a multi-pin package and the like, in case that either a pitch of the electrode pads is small, or an area of the electrode pads is small, a conducting pattern 4 is formed on an insulating film, one edge length of which is longer than the chip, and also a pad 2AN having a larger area than that of the electrode pads on the chip is provided at a peripheral portion of this insulating film with the result that a sufficiently large area used for wire-bonding the electrode pads may be obtained.

Also, the present embodiment may be very useful for such a connecting method that no wire is employed, e.g., TAB (Tape Automated Bonding) and CCB (Controlled Collapse Bonding).

In accordance with the above-explained various embodiments, since the desirable external lead terminals may be arbitrarily obtained without modifying designs of the elements as well as the dimensions of these devices, a circuit pattern of a printed circuit board may be effectively designed with employment of the inventive devices, and further the printed circuit board may be made compact, thereby achieving the optimum design effects. Also, since the electrode pads may be arranged at any positions during the layout designing stages of the chips without considering the subsequent manufacturing processes, the degree of freedom in designing the elements may be increased. It should be noted that each of the above-described embodiments has such a merit of chip interchangeability that, for instance, a chip having an LOC structure may be mounted on the conventional lead frame. Although one electrode pad has been connected to one line in the above-described respective embodiments, a plurality of electrode pads may be connected to one line.

Furthermore, in accordance with the first embodiment, since both the area and pitches of the electrode pads for the chip are expandable, reliabilities in the wire bonding operation performed in the fine-treated structure for the multi-pin package are not lowered, and also this embodiment may be effective even in such connecting methods without employing wires, e.g., TAB and CCB.

What is claimed is:

1. A semiconductor device comprising:
    a chip pad having a conducting pattern;
    a semiconductor chip having electrode pads to be coupled to the chip pad; and
    leads connected via the conducting pattern to the electrode pads,
    wherein the chip pad, the chip and at least a portion of the leads are encapsulated,
    wherein through-holes are formed in said chip pad at positions corresponding to the electrode pads of the semiconductor chip,
    wherein said conducting pattern is formed on an insulating coat formed on the chip pad,
    wherein the semiconductor chip is mounted on a surface of the chip pad opposite to a surface thereof on which the conducting pattern is formed in such a manner that the electrode pads face towards said through-holes,
    wherein the electrode pads of the semiconductor chip are electrically connected to said conducting pattern by first conducting members provided within said through-holes and
    wherein said conducting pattern is electrically connected to said leads by second conducting members.

2. A semiconductor device as claimed in claim 1, wherein said second conducting members are conducting wires for connecting at least one set of the electrode pads and said conducting pattern.

3. A semiconductor device as claimed in claim 1, wherein said first conducting members and/or said second conducting members are conducting wires covered with an insulating material.

4. A semiconductor device as claimed in claim 1, wherein said first conducting members and/or said second conducting members are made of a solder.

5. A semiconductor device as claimed in claim 1, wherein the conducting pattern includes a plurality of conductive lines arranged parallel to each other along a longitudinal direction of the semiconductor chip.

6. A semiconductor device as claimed in claim 5, wherein at least one of said conductive lines has at least one portion having a width larger than that of another portion, and wherein one end of the second conducting member associated with said conductive line is connected to said at least one portion having the larger width.

7. A semiconductor device as claimed in claim 1, wherein an interval between a first line of leads and a second line of leads positioned across the chip pad from each other is smaller than a predetermined dimension of the semiconductor chip.

8. A semiconductor device as claimed in claim 1, wherein those portions of the leads which are connected to said second conducting members are arranged along longitudinal sides of the chip pad.

9. A semiconductor device comprising:
    a chip pad having a conducting pattern;
    a semiconductor chip having electrode pads to be coupled to the chip pad; and
    leads connected via the conducting pattern to the electrode pads,
    wherein the chip pad, the chip and at least a portion of the leads are encapsulated,
    wherein said chip pads are insulating members in which through-holes are formed at positions corresponding to the electrode pads of said semiconductor chip,
    wherein the semiconductor chip is mounted on a surface of the chip pad opposite to a surface thereof on which the conducting pattern is formed in such a manner that the electrode pads thereof face towards said through-holes,
    wherein the electrode pads of the semiconductor chip are electrically connected to said conducting pattern by first conducting members provided within said through-holes and
    wherein said conducting pattern is electrically connected to said leads by second conducting members.

10. A semiconductor device as claimed in claim 1, wherein said second conducting members are conducting wires for connecting at least one set of the electrode pads and said conducting pattern.

11. A semiconductor device as claimed in claim 1, wherein said first conducting members and/or said second conducting members are conducting wires covered with an insulating material.

12. A semiconductor device as claimed in claim 1, wherein said first conducting members and/or said second conducting members are made of a solder.

13. A semiconductor device as claimed in claim 1, wherein the conducting pattern includes a plurality of conductive lines arranged parallel to each other along a longitudinal direction of the semiconductor chip.

14. A semiconductor device as claimed in claim 13, wherein at least one of said conductive lines has at least one portion having a width larger than that of another portion, and wherein one end of the second conducting member associated with said conductive line is connected to said at least one portion having the larger width.

15. A semiconductor device as claimed in claim 1, wherein an interval between a first line of leads and a second line of leads positioned across the chip pad from each other is smaller than a predetermined dimension of the semiconductor chip.

16. A semiconductor device as claimed in claim 1, wherein those portions of the leads connected to said second conducting members are arranged along longitudinal sides of the chip pad.

17. A semiconductor device comprising:
a semiconductor chip having electrode pads; and
leads connected to the electrode pads,
wherein the chip pad and at least a portion of the leads are encapsulated,
wherein a surface of said semiconductor chip on which the electrode pads are formed is covered with an insulating material,
wherein through-holes are formed in said insulating material at positions facing said electrode pads,
wherein a conducting pattern is provided on a surface of said insulating material,
wherein the electrode pads of the semiconductor chip are electrically connected to said conducting pattern by first conducting members provided within said through-holes, and
wherein said conducting pattern is electrically connected to said leads by second conducting members.

18. A semiconductor device as claimed in claim 17, wherein said second conducting members are conducting wires for connecting at least one set of the electrode pads and conducting pattern.

19. A semiconductor device as claimed in claim 17, wherein said first conducting members and/or said second conducting members are conducting wires covered with an insulating material.

20. A semiconductor device as claimed in claim 17, wherein said first conducting members and/or said second conducting members are made of a solder.

21. A semiconductor device as claimed in claim 17, wherein the conducting pattern includes a plurality of conductive lines arranged parallel to each other along a longitudinal direction of the semiconductor chip.

22. A semiconductor device as claimed in claim 21, wherein at least one of said conductive lines has at least one portion having a width larger than that of another portion, and wherein one end of the second conducting member associated with said conductive line is connected to said at least one portion having the larger width.

23. A semiconductor device as claimed in claim 17, wherein an interval between a first line of leads and a second line of leads positioned across the semiconductor chip from each other is smaller than a predetermined dimension of the semiconductor chip.

24. A semiconductor device as claimed in claim 17, wherein those portions of the leads which are connected to said second conducting members are arranged along longitudinal sides of the chip pad.

25. A semiconductor device as claimed in claim 1, wherein the electrode pads are directly connected with the first conducting members.

26. A semiconductor device as claimed in claim 1, wherein the electrode pads are directly connected with the first conducting members.

27. A semiconductor device as claimed in claim 17, wherein the electrode pads are directly connected with the first conducting members.

* * * * *